(12) United States Patent
Ouchi (10) Patent No.: US 7,245,796 B2
(45) Date of Patent: Jul. 17, 2007

(54) OPTICAL INTERCONNECTION DEVICE, PHOTOELECTRIC MIXEDLY MOUNTED DEVICE AND ELECTRONIC EQUIPMENT USING SAME

(75) Inventor: Toshihiko Ouchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/441,745

(22) Filed: May 25, 2006

(65) Prior Publication Data

US 2006/0228068 A1   Oct. 12, 2006

Related U.S. Application Data

(63) Continuation of application No. 10/693,173, filed on Oct. 23, 2003, now Pat. No. 7,103,248.

(30) Foreign Application Priority Data

Oct. 25, 2002   (JP) .............................. 2002-310398

(51) Int. Cl.
  *G02B 6/12* (2006.01)
(52) U.S. Cl. ................. 385/14; 385/129; 385/130; 385/131
(58) Field of Classification Search ............ 385/14, 385/129
  See application file for complete search history.

(56) References Cited

U.S. PATENT DOCUMENTS

| | | | |
|---|---|---|---|
| 6,529,667 B2 | 3/2003 | Nashimoto | 385/129 |
| 6,766,083 B2 | 7/2004 | Bona et al. | 385/40 |
| 6,845,184 B1 * | 1/2005 | Yoshimura et al. | 385/14 |
| 6,928,205 B2 * | 8/2005 | Ouchi | 385/14 |
| 6,977,820 B2 * | 12/2005 | Uchida | 361/761 |
| 2006/0062512 A1 * | 3/2006 | Lee et al. | 385/15 |

FOREIGN PATENT DOCUMENTS

| | | |
|---|---|---|
| JP | 62-194219 | 8/1987 |
| JP | 8-293836 | 11/1996 |

OTHER PUBLICATIONS

English Abstract of JP 62-194219, esp@cenet database—Worldwide, published Aug. 26, 1987.
English translation of JP 62-194219—Feb. 21, 1986.

* cited by examiner

Primary Examiner—Jennifer Doan
(74) Attorney, Agent, or Firm—Morgan & Finnegan, LLP (57) ABSTRACT

An optical interconnection device is provided which comprises an optical waveguide layer, wherein the waveguide layer is equipped with a plurality of electrodes which are independently drive-controllable such that a refractive index distribution is generated in the waveguide layer by drive control of the electrodes to control a propagation state of light in the waveguide layer, and an optical interconnection port is provided on an upper or lower surface or inside of the waveguide layer.

4 Claims, 5 Drawing Sheets

OPTICAL INTERCONNECTION DEVICE, PHOTOELECTRIC MIXEDLY MOUNTED DEVICE AND ELECTRONIC EQUIPMENT USING SAME

This is a continuation of U.S. Ser. No. 10/693,173, filed Oct. 23, 2003, now U.S. Pat. No. 7,103,248, which is incorporated by reference.

BACKGROUND OF THE INVENTION

1. Field of the invention

The present invention relates to an optical interconnection device and a photoelectric mixedly mounted device (or optical electric hybrid device) including an optical waveguide and an optical interconnection port for optically connecting a signal between electric chips on an electric circuit board and mutually between electric circuit boards and so on and an electronic equipment using them.

2. Related Background Art

A large number of highly integrated LSI chips are used to enhance performance of mobile equipments, digital AV (audiovisual) equipments and so on represented by personal computers, cellular phones and PDAs that support the advanced information society, and a mounting technology for operating them at high density and high speed is searched for. In this regard, the mounting technology in the past using only electric connections has shown its limit as to solutions to the problems of transmission delay and crosstalk, reduction in electromagnetic interference (EMI) and so on, and so a method of using optical interconnection together with it is now considered.

There are some proposals of examples of applying the optical interconnection between the chips. For instance, it is considered that the method of using a slab waveguide comprised of an organic polymer formed on a flat substrate as a transmission medium has advantages of matching well with the LSI chips and a board and packages for mounting them, being easy to manufacture and capable of free connections between the chips compared to the method of creating a linear optical waveguide (Japanese Patent Application Laid-Open No. H8-293836 for instance).

Figure 8:
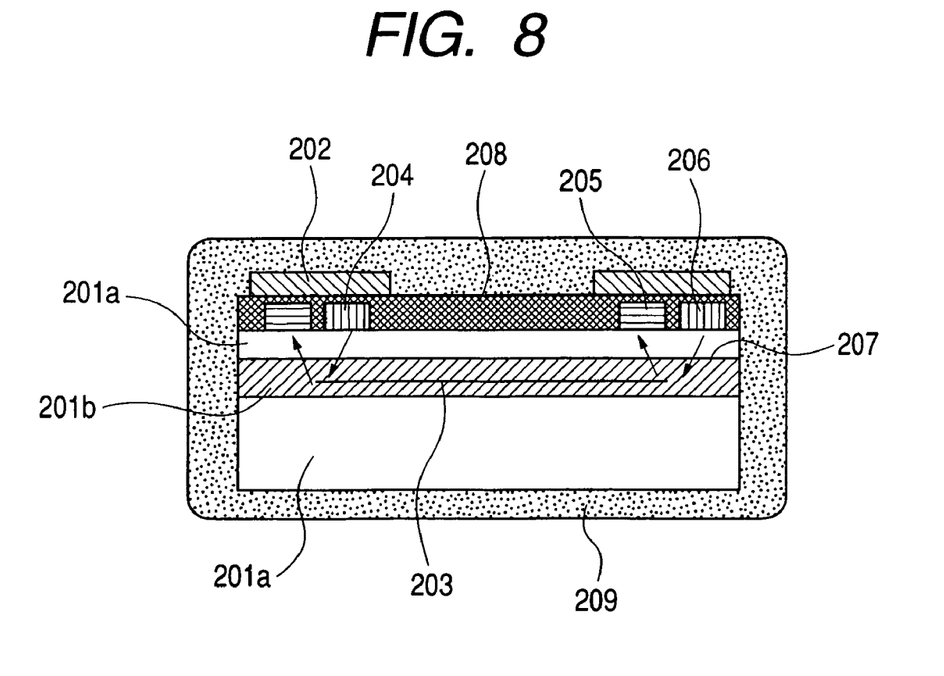
FIG. 8 is a diagram showing a prior art example of an optical interconnection device using an optical waveguide layer.

The example disclosed in the patent laid-open gazette is shown in FIG. 8. An insulating layer 208 of a substrate 201a having an optical waveguide, layer encapsulated by a polymer sealant 209 is equipped with transmission elements 204 and 206 and a reception element 205, and has an LSI board 202 implemented to realize signal transmission between LSIs by using a slab optical waveguide 201b (signal light 203). A hologram 207 is used for optical coupling between the transmission elements 204, 206, reception element 205 and waveguide 201b, and a coupling state between the elements is further controlled by an element for controlling a wavelength.

However, as the method disclosed in the patent laid-open gazette controls a connection between the LSI chips by using a wavelength control element, high stability is required of the transmission elements and wavelength control element so that it may be difficult to be implemented in the proximity of the LSI where temperature environment is not necessarily good.

SUMMARY OF THE INVENTION

An object of the present invention is to provide an optical interconnection device and a photoelectric mixedly mounted device capable of implementing optical reconfigurable wiring in an optical waveguide layer and an electronic equipment using them.

The optical interconnection device provided by the present invention is an optical interconnection device comprising an optical waveguide layer, wherein the waveguide layer is equipped with a plurality of electrodes which are independently drive-controllable such that a refractive index distribution is generated in the waveguide layer by drive control of the electrodes to control a propagation state of light in the waveguide layer, and an optical interconnection port is provided on an upper or lower surface or inside of the waveguide layer.

The photoelectric mixedly mounted circuit of the present invention is constituted by integrating the optical interconnection device of the present invention with an electronic device and an electric wiring layer connected to the optical interconnection port provided in the optical interconnection device.

By installing the photoelectric mixedly mounted device of the present invention, the electronic equipment of the present invention is constituted to be capable of freely reconfiguring connections between IC chips and effecting switching of a plurality of installed systems with one device.

According to the optical interconnection device of the present invention, the way of optical interconnection between optical interconnection ports which are input part and/or output part of light can be reconfigured, and an input/output port for optical interconnection is provided on an upper or lower surface or inside of the waveguide layer to enable propagation of light inside the waveguide layer.

According to the present invention, it is possible to implement a reconfigurable optical interconnection device capable of switching transmission signals in an electronic equipment and so on.

DETAILED DESCRIPTION OF THE PREFERRED EMBODIMENTS

The optical interconnection device, photoelectric mixedly mounted device and electronic equipment of the present invention have the above-mentioned configuration.

The following embodiments are effected based on the above basic configuration.

Figure 2A:
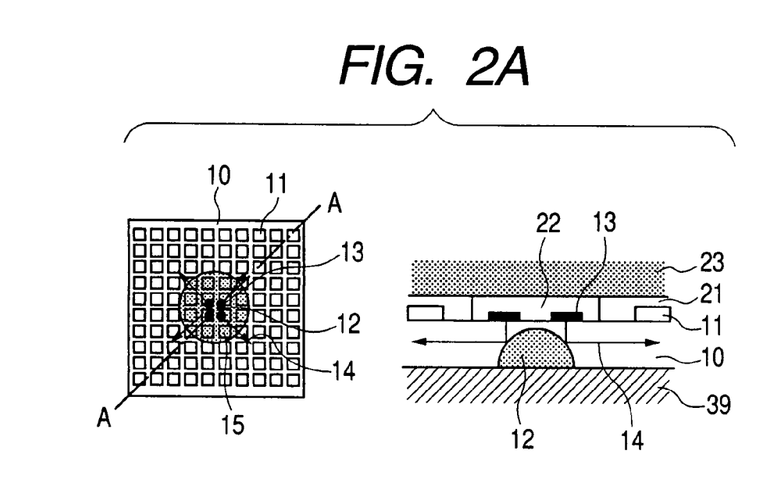
FIGS. 2A, 2B, 2C and 2D are diagrams for explaining operation examples of the photoelectric mixedly mounted chip according to the present invention.
Figure 2B:
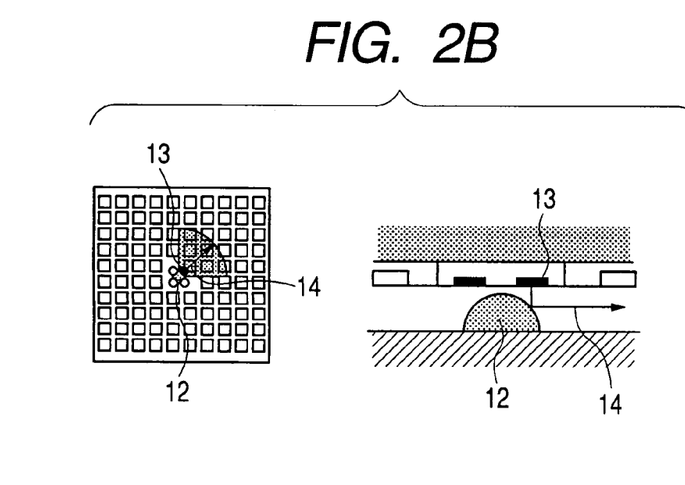
Figure 2C:
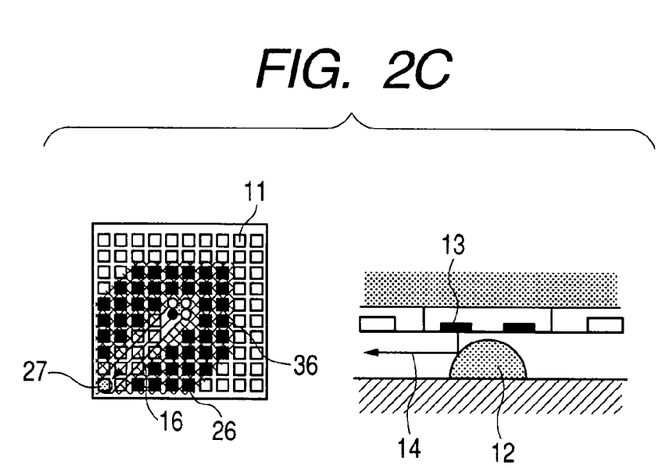

The above-described optical interconnection port include the one comprised of an optical element (light-emitting element or light-receiving element) for receiving or emitting a light in a direction approximately perpendicular to a light-waveguiding surface and an optical path conversion means (an element for converting (or changing or modifying) an optical path to achieve optical coupling between the optical element and a waveguide layer) provided corresponding to the optical element at a desired position in the above-described waveguide layer (hereafter, sometimes referred to as "slab optical waveguide layer"). Thus, in the slab optical waveguide capable of freely controlling a refractive index distribution in a two-dimensional plane, by providing the optical interconnection port comprising the optical path conversion means at an arbitrary position, it is possible to construct an inter-IC-chip optical interconnection device. In such an optical interconnection port, as shown in FIGS. 2A to 2C, a metallic mirror (light reflector) or the like having a convex portion of an approximately hemispherical or conical shape may be buried therein, and a surface element such as a surface light-emitting laser or a surface pin photodiode may be mounted above the convex portion so as to emit or receive the light approximately perpendicularly to the slab optical waveguide surface. At this time, it is possible, by mounting a plurality of arrayed optical elements around a top of the convex of the light reflector with their centers deviated from the top, to optically couple each optical element only to a limited area of the slab optical waveguide such that each element has its responsible area. In the case of burying the optical interconnection port in the inside of the waveguide, it is possible to provide a type free from the optical path conversion means by orienting a light incidence direction from an optical output port to be able to be coupled to the waveguide in advance or orienting a light-emitting direction to be able to be coupled to an optical input port in advance.

The above-described drive-controllable electrodes may be formed such that they are divided into a plurality and provided on one side or both sides of the above-described waveguide to be able to apply a current or a voltage or both of them. In doing so, variable control of a refractive index distribution can be implemented by employing the electrodes also as heaters, and controlling temperature of each portion of the optical waveguide by a current injection amount thereto or applying an electric field between tow electrodes and controlling a voltage applied to each portion of the optical waveguide.

Figure 1:
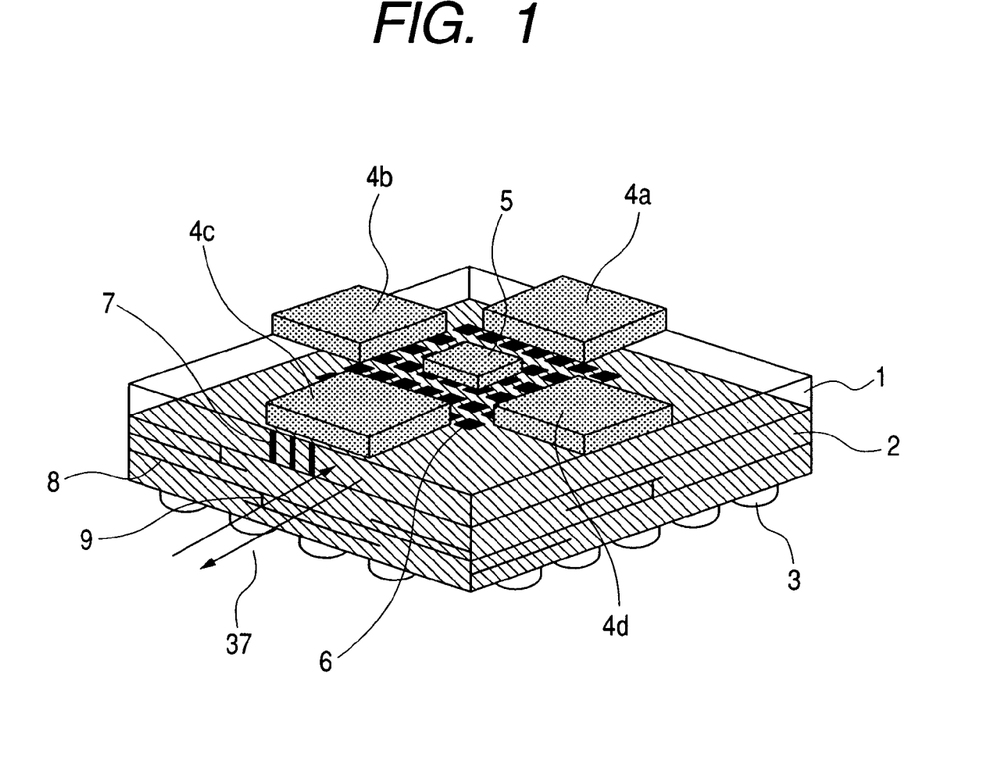
FIG. 1 is a perspective view of a photoelectric mixedly mounted chip according to a first example of the present invention.
Figure 3:
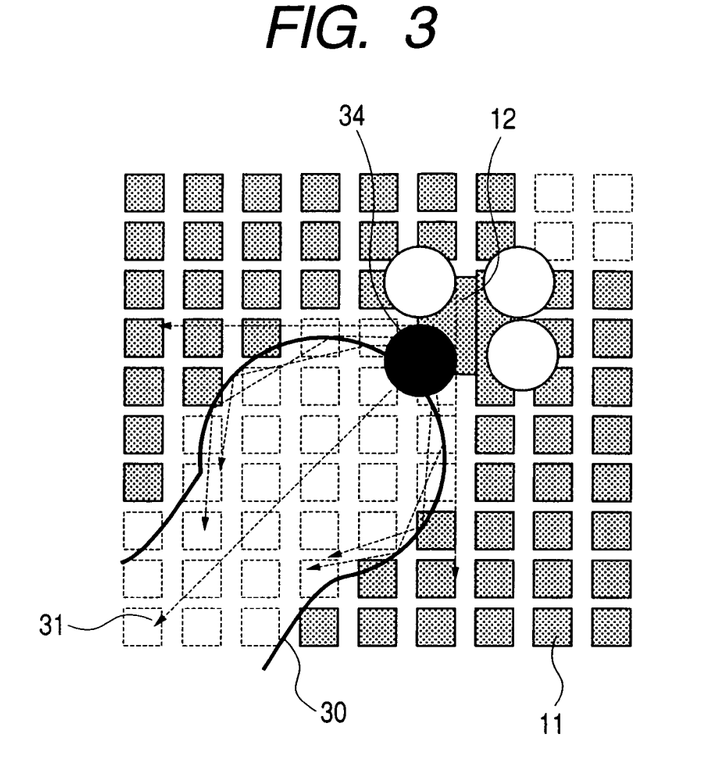
FIG. 3 is a diagram for explaining an example of refractive index control of an optical waveguide layer according to the present invention.

In the case of allowing the above-described independently drivable electrodes to function as heaters, it is possible, by generating a temperature difference of about 40° C. in an optical polymer such as PMMA (polymethyl methacrylate) that constitutes the slab waveguide, to constitute an optical waveguide in the slab waveguide as in FIG. 2C. Further, it is also possible to effect the function as a lens or prism as shown in FIG. 3, for instance, by a refractive index difference resulting from the temperature difference. The propagation state such as deflection of light, convergence of light or waveguiding direction of light can be freely and variably controlled in one slab waveguide in accordance with the manner of controlling the temperature of the electrode heaters. Therefore, in the case of mounting IC chips as shown in FIG. 1, for instance, the optical interconnection between the chips can be reconfigured depending on the system.

As the manner of effecting variable control of a refractive index distribution, in the case of utilizing the electric field resulting from the electrodes, it is possible to realize the same operation as that in the case of the heater control, for instance, by using for the slab waveguide a material of a high electro-optic coefficient such as an organic polymer having azobenzene pigment coupled to PMMA. In this case, controllability of the refractive index distribution is further improved by providing the electrodes on both sides of the optical waveguide layer as in FIG. 6. The plurality of electrodes can be disposed regularly in a uniform size like a grid or formed and arranged in a smaller size in the vicinity of the optical element than in other portions, and their placement pattern, size, shape and so on can be appropriately designed as needed.

The optical waveguide layer (slab optical waveguide layer) can be formed of PMMA, polycarbonate, Arton (trade name), polyimide, SU-8 (trade name), siloxane, and organic material polymer or oligomer having functional groups linked to the main chain or side chain of these materials.

Thus, according to the present invention, it is possible, as compared to a free connection using a three-dimensional space, to merge with the electronic equipment such as an IC to be integrated therewith in a very small size so as to realize the optical interconnection device excellent in reduction in the number of components, improvement in controllability and so on as compared to the prior art method of changing a connection state by wavelength control by using a two-dimensional transmission line.

The photoelectric mixedly mounted device of the present invention for attaining the above object is characterized in that the optical interconnection device is integrated with an electronic device such as an IC chip and an electric wiring layer connected to the optical interconnection port provided in the apparatus. It is possible, by this configuration, to realize a system LSI or the like as mounted in a high density that is capable of switching the system at a high speed. This system LSI can function as a system-on-chip (SoC) for manifesting multiple functions with one chip or as a system-in-package (SiP) for mounting as a package in an electric circuit board. As a matter of course, it can also be utilized as a photoelectric mixedly mounted substrate to be utilized as one daughter board. Thus, the photoelectric mixedly mounted device of the present invention includes a chip level one to a substrate level one in terms of the size, mounting method, application method, operation system and so on. Further, for the connection between such photoelectric mixedly mounted devices, it is also possible to use the optical interconnection for directly transfer light between the slab optical waveguide layer and the outside.

The pattern of the optical interconnection of the photoelectric mixedly mounted device can be recorded in a memory inside or outside the apparatus; the pattern can be read from the memory in accordance with an instruction to change the optical interconnection to switch the operation of the device at high speed, or can be downloaded as a design asset from the outside of the device and rewritten, whereby the operation of the device can be switched at a high speed on downloading.

Hereafter, concrete examples will be described with reference to the attached drawings in order to clarify the preferred embodiments of the present invention.

FIRST EXAMPLE

FIG. 1 shows a perspective view of a photoelectric mixedly mounted device according to a first example of the present invention. According to this example, a substrate 2 constituting a multilayered electric wiring layer and an optical waveguide layer (slab waveguide) 1 allowing an optical free connection are stacked and integrated. The optical waveguide layer 1 of one layer is integrated on the topmost surface in the form shown in FIG. 1. As will be described later, however, it may also be the form in which a multilayered optical waveguide layer is integrated inside the electric wiring layer.

The material of the substrate 2 constituting the multilayered electric wiring layer may be FR4 for constituting a printed circuit board, or may be an organic material such as a polyimide resin or an aramid resin, an inorganic ceramic material such as $Al_2O_3$ or AlN, glass or a hybrid material having mixed them. The electric wiring layer is built up so that electric wiring 8 of each electric wiring layer is mutually connected by a via hole 9 and an electrodes 3 as interfaces to the outside are provided so that so-called SiP for having one function as the entire chips can be constituted. To be more specific, the chip form is a chip size package (CSP) the size of which is about 10 mm square to 50 mm square. It is also feasible to incorporate into the multilayered electric wiring layer a passive chip such as a resister, a capacitor or a coil, or an active chip such as an IC.

A resin optical waveguide layer 1 of a slab type is integrated above this electric wiring layer, and a number of electrodes 6 arranged like a grid as a characteristic of this example are provided on the optical waveguide layer. Each of the electrodes 6 has independently drivable wiring (not shown) connected thereto so that the propagation state of the light propagating in the slab waveguide 1 can be controlled. This control method will be described later. Bare chips Si-LSI 4a-4d and 5 are further mounted on the waveguide layer 1 so that the optical interconnection can be made between the chips by optical I/O elements (constituting the optical input port and/or output port) integrated under the chips, that is, a semiconductor laser and a pin photodiode, to be more precise. As for the bare chips, a so-called wafer-level chip size package (WLCSP) having the electrodes for making an electric connection simultaneously created therein on manufacturing the LSI is preferably used. The interconnection between the chips is performed by the optical interconnection in a reconfigurable wiring portion, and is performed by a via wiring 7 or the like formed in the optical waveguide layer 1 in an electric connection portion. The connection to the outside of the chips can also be made by optical space transmission 37 from the optical waveguide layer 1. In this example, the size of the optical waveguide layer 1 is the same as that of the substrate 2. However, it is not limited thereto, but the optical waveguide layer may be provided only to an area requiring it.

Next, the variable control and operation of this optical reconfigurable interconnection will be described by using FIGS. 2A to 2D. FIGS. 2A to 2D show four major light propagation modes. The left-hand view of each of FIGS. 2A to 2C is a plan view. The right-hand view of FIG. 2A is a sectional view of an optical interface portion taken along line A-A of the left-hand view and the same applies to FIGS. 2B and 2C. In this plan view, there is an optical interface portion corresponding to the chip of reference numeral 5 in FIG. 1 at the center and there are also optical interface portions at edges of the four sides, but only the used portions are shown. Here, the case of having the interface portion at-the center will be described. However, the position thereof is not limited to the center but is arbitrary.

FIG. 2A is a mode for transmitting signals from the interface portion at the center to all directions of a slab waveguide 10. A surface light emitting laser 22 of a 2×2 array is adhered at the center. A light emitting point 13 is placed while being deviated from the top of the light reflector 12 as shown in the right-hand sectional-view to effect optical coupling as shown by an arrow of a light beam 14 so that one surface light-emitting laser propagates inside the slab waveguide 10 at an emission angle of approximately 90 degrees. A hemispherical metallic mirror is used for the light reflector 12 as in the right-hand sectional view, for instance. Here, the number of arrays of the surface light-emitting lasers 22, the propagation direction angle of the laser, and the shape of the light reflector 12 and so on are not limited thereto. In the plan view of FIG. 2A, reference numeral 14 denotes a proceeding direction of one surface light-emitting laser, and reference numeral 15 denotes the state of optical propagation in the optical waveguide 10 in the case of driving all the four lasers. Therefore, if the four surface light-emitting lasers 22 are simultaneously driven with the same signal, the signal can be distributed in a broadcast fashion entirely over the whole area of the optical waveguide 10. Although the light receiving elements are not shown, the light entering in all directions can be received if they are arranged in a 2×2 array so as to fill clearances of the surface light-emitting lasers 22.

Here, PMMA is used as the material of the waveguide 10, but it may be any one of optical resin materials such as polyimide, polycarbonate, polycarbonate Z, siloxane or the like. In FIGS. 2A to 2C, reference numeral 21 denotes an insulating layer of a resin or the like for flattening or electric wiring formation after mounting the surface light emitting lasers 22, and reference numeral 23 denotes an LSI chip, and reference numeral 39 denotes the electric wiring layer. A part or all of input/output signals of the LSI chip 23 are multiplexed and connected to the optical interface.

As for the surface light-emitting lasers 22 in this example, a low power consumption, 850 nm oxide-type of which threshold is 0.5 mA, operating current at 1 mW output is 1 mA and voltage is 2.2V was used. As a matter of course, it is possible to further reduce the power consumption by using a type of a different waveband, that is, 1.3 µm band in particular. Here, in the case of 1 mW output, it is designed such that a signal can be transmitted by using an optical free connection sheet (optical waveguide) of 3 cm square if a signal reception sensitivity of −30 dBm is attained with a 100 µm φ photo-detector. The optical interface portion may be mounted either in the form capable of obtaining electric contact on the surface of the LSI chip 23 or inversely in the form of flip-chip-bonding the LSI chip 23 by mounting it on the optical waveguide 10 in advance so as to have electrode contact with the optical interface.

Next, FIG. 2B shows the case of driving only one of the four surface light-emitting lasers 22. As already-mentioned, a transmission area of 90 degrees can be covered in this case. A white circle indicates the surface light emitting lasers not driven. This mode is used in the case where the transmission is necessary only to a particular area.

In FIG. 2C, one surface light emitting laser 22 emits the light at the emission angle of 90 degrees, and then a current is passed to electrodes 11 (reference numeral 26 denotes driven electrodes) in an adequate area of the slab waveguide 10 so as to change the refractive index of the adequate area of the slab waveguide 10 and form a waveguide 16. The optical interconnection is thereby performed only to a particular point (active port) 27. As for the electrodes 11, it is possible to adopt a thin film of Ti/Pt (thickness of 10 nm/100 nm for instance) and render the film as a resistor member of several tens of ohms and operate them as a heater by forming the thin film into a thin line pattern meandering in the area of 50 μm square (in the area indicated as the square electrodes 11 in FIG. 2). The electrodes 11 as the heaters may be made of Cr, Au, an alloy or a compound.

In the case of the slab waveguide 10 of PMMA, the change in refractive index when changing the temperature with the heaters is $\delta n/\delta T \sim -1 \times 10^{-4}$ $(K^{-1})$ Therefore, if the temperature around the waveguide 16 is raised by 40 degrees, the refractive index is reduced from 1.492 to 1.488 so that the optical waveguide 16 having a relative refractive-index difference of approximately 0.3 percent can be formed. The area to be heated is a crosshatched area 36 shown in FIG. 2C, where control may be exerted not over the entire optical waveguide layer but over necessary electrodes 26 painted in gray. As the transmission through the optical waveguide 16 reduces losses and the reception at a point 27 is thereby improved so as to allow high-speed optical interconnection. In this case, a component of light that could not be coupled to the optical waveguide 16 formed by refractive-index control by the heaters are scattered. Thus, it is also possible to increase the refractive-index difference by further raising the heater temperature in the vicinity of the transmission portion and to thereby improve a light receiving angle or NA as the optical waveguide so as to decrease the scattered component. Alternatively, it is also possible to divide the heaters (electrodes 11) into a smaller size (20 μm square for instance) only in the vicinity of the transmission portion and drive the electrodes 11 as shown in FIG. 3 (driven electrodes are shown in gray) so that an isothermal line 30 is formed in a lens shape to impart a light converging effect as with the beam indicated by reference numeral 31. Reference numeral 34 denotes the surface light-emitting laser that is driven. It is thereby possible to improve coupling efficiency for making the light spreading in a 90-degree emission angle direction incident on the waveguide 16 formed by the refractive-index control. Such control may be performed likewise in a reception portion.

Figure 2D:
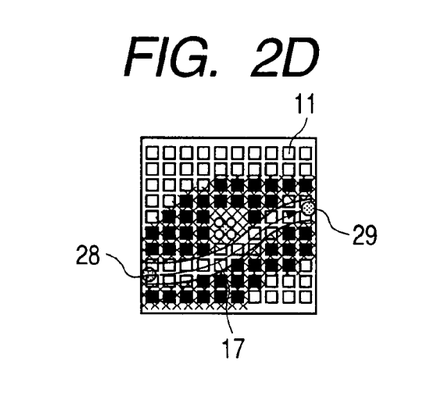

FIG. 2D shows the case where, without operating the interface portion at the center, the optical interconnection is performed between chips mounted in edge portions of an optical waveguide. As with the above case, it is possible to perform the optical interconnection between desired active points (ports) 28 and 29 by driving the heaters (electrodes 11) to form a waveguide 17 as shown in the figure.

Although it is not illustrated, it is also possible to raise the temperature of the waveguide 16 locally (in a triangular pattern when viewed from above, for instance) and thereby provide a large refractive-index difference so as to form a prism and deflect or branch the beam. It is possible, by combining such operations, to perform the high-speed optical interconnection between the LSI 4a to 4d and 5 in FIG. 1, and besides, the connection form can be reconfigured by programming.

It is possible, by having such operations performed, to provide a chip such as FPGA that can operate at a high speed as a plurality of systems by modifying the wiring in situ. The modification for reconfiguring the wiring can be made by msec order determined by a thermal time constant so that, as with software radio, the operation of seamlessly switching the systems with one chip can be realized. It is also possible to construct a new wiring-modifiable architecture of which reference numeral 5 is a CPU and 4a to 4d are memories. It is further possible to incorporate an IP (Intellectual Property) for wiring modification in advance based on a nonvolatile memory in the chip and rewrite the IP as needed. Alternatively, it can be downloaded via the Internet so as to change the manner of modification as required.

SECOND EXAMPLE

Figure 4:
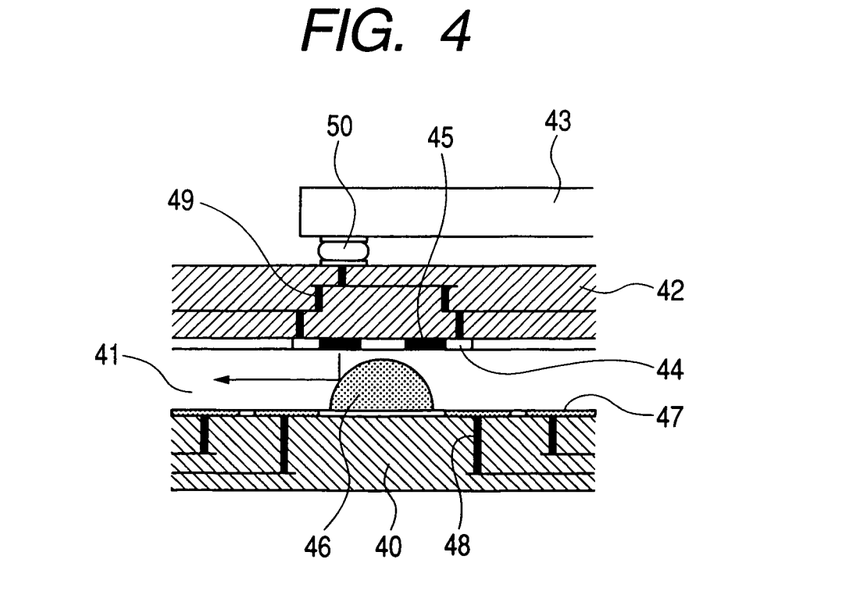
FIG. 4 is a sectional view of a photoelectric mixedly mounted device according to a second example of the present invention.

A second example of the present invention is a photoelectric mixedly mounted device of the configuration wherein an optical waveguide layer with electrodes is inserted into a substrate constituting an electric circuit and an optical element and a light reflector are simultaneously buried therein. FIG. 4 is a sectional view showing the configuration of a part near the transmission portion. The transmission portion of a slab waveguide 41 has surface light emitting lasers 44 of a 2×2 array and a light reflector 46 as with the first example. Surface light-emitting lasers 44 are electrically connected to the other chips and a power supply by a wiring 49 formed inside an electric circuit board 42, and emits a light from a light-emitting portion 45. As for the surface light-emitting lasers used here, thin-film, surface-light-emitting lasers produced by a technology called Functional Layer Transfer (FLT) for integrating only a processed epitaxial layer of approximately 6 μm in thickness are preferably used. This is because, as the thickness of a semiconductor substrate is about 100 μm, an ordinary surface-light-emitting laser is not suited to the configuration to be three-dimensionally stacked as in FIG. 4. The light-receiving element can also be rendered as thin film by the same method.

A bare chip 43 of an LSI is flip-chip-mounted on an electric circuit board 42 by using a solder ball 50. The connection between the LSI chip 43 and a built-in optical element is also made through a via wiring 49 formed on the electric circuit board 42 as in FIG. 4. Heater electrodes 47 are formed on an optical waveguide layer surface on the opposite side to the surface light emitting lasers 44, and the currents for independently driving the heater electrodes 47 can be supplied by a buildup wiring 48 in a substrate 40.

It is possible, by having such a configuration, to keep the LSI chip 43 and the heater electrodes 47 apart from each other to avoid their mutual thermal interference. It is also possible to avoid the thermal interference with the surface light emitting lasers 44 so that thermal control can be performed even in the vicinity of the light reflector 46, allowing such refractive index control of the optical waveguide layer 41 as to enhances the light focusability.

Figure 5:
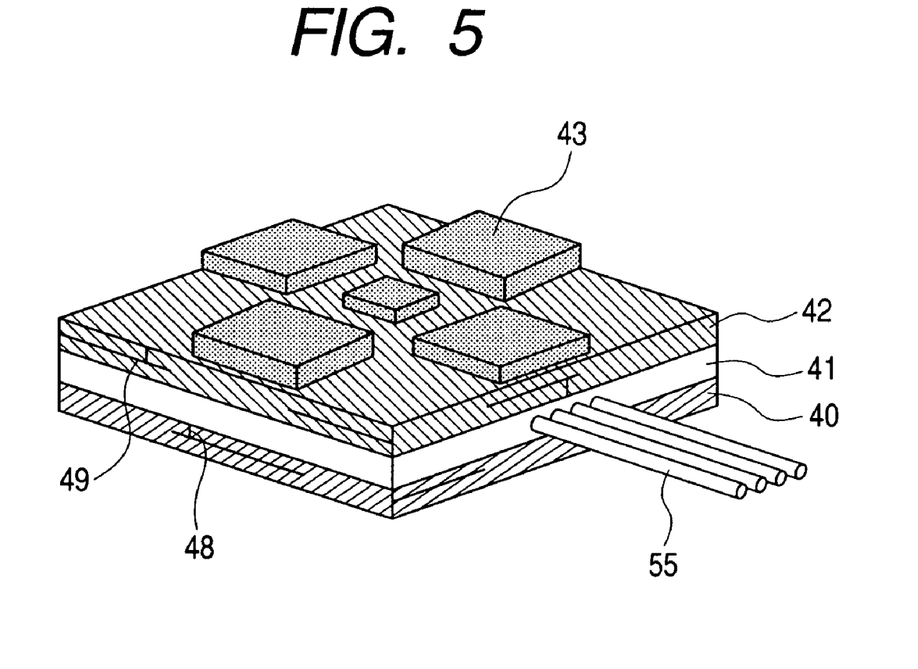
FIG. 5 is a perspective view of the photoelectric mixedly mounted device according to the second example of the present invention.

FIG. 5 shows a perspective view of a photoelectric mixedly mounted device having such a configuration. The same portions as those in FIG. 4 are numbered likewise. Thus, it is possible, in the substrate having one function in its entirety, to provide an apparatus having a built-in optical reconfigurable wiring capable of programming and suited to operating a high-performance digital equipment. The optical waveguide layer 41 may be equipped with an optical waveguide member 55 such as an optical fiber for the sake of an optical interface with another substrate. As a matter of course, it is also feasible to provide a terminal for electric connection, which is not shown.

Although the form in FIG. 5 is referred to as "substrate", it can integrate functional elements at a high density in one substrate to have them function as one system unlike the printed circuit board in the prior art, so that it can also be three-dimensionally integrated to be constituted as a so-called system-on-chip (SoC) that functions as one chip.

THIRD EXAMPLE

Figure 6:
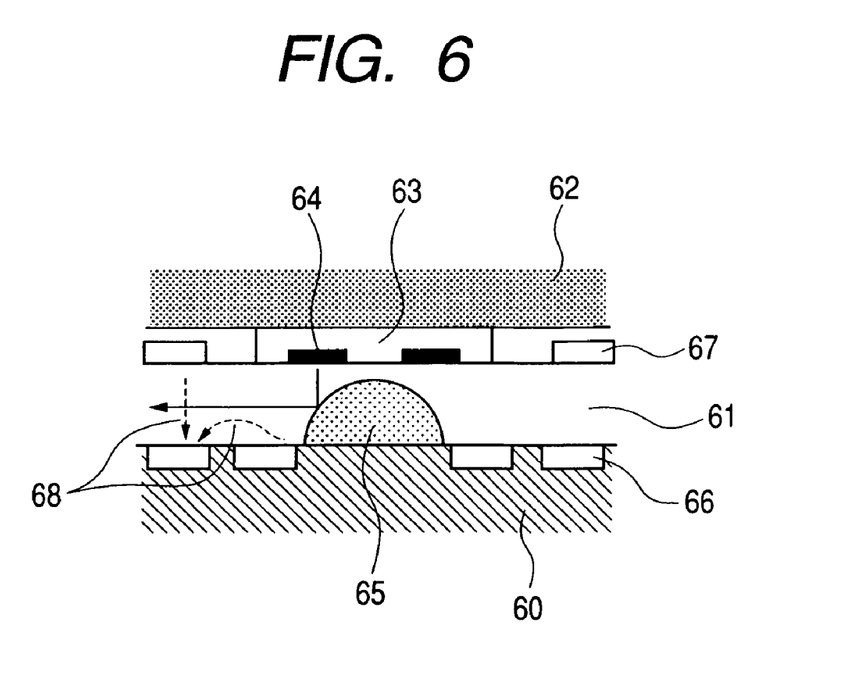
FIG. 6 is a sectional view of a photoelectric mixedly mounted chip according to a third example of the present invention.

A third example of the present invention is characterized, as shown in FIG. 6, by having electrodes 66 and 67 for controlling the refractive index of the optical waveguide on both sides of an optical waveguide layer 61. Otherwise, the configuration is almost the same as the above-described examples. It is possible, by having the electrodes on both sides, to control the refractive index in a finer distribution. The refractive index can be more precisely controlled if the positions of the upper and lower electrodes 66 and 67 mutually deviate. In FIG. 6, reference numeral 60 denotes an electric wiring layer, 61 denotes an optical waveguide layer, 62 denotes an IC chip, 63 denotes a surface light-emitting laser, 64 denotes a light-emitting point and 65 denotes a light reflector.

Although the preceding examples describe the refractive index control of the optical waveguide layer by heat, the method of controlling the refractive index by applying an electric field between two electrodes may also be used. To generate such an electro-optical effect (EO effect), a nonlinear material is required, and an optical crystal such as $LiNbO_3$ is generally used. For the use intended by the present invention, however, a transparent organic polymer having a nonlinear pigment or the like combined thereto is preferably used for the optical waveguide layer in the light of cost and freedom of design. According to the third example, it is possible, for instance, to use PMMA having an azobenzene pigment coupled to a side chain thereof for the optical waveguide layer 61 so as to control the refractive index by using the EO effect. According to this example, the electrodes 66 and 67 are provided to the upper and lower surfaces of the optical waveguide layer 61 so that waveguide control can be effected with less polarization dependency. To be more specific, the polarization dependency can be reduced by combining vertical and horizontal electric fields such as shown by reference numeral 68 to control the optical waveguide layer 61. As for other materials to be used here, it is possible to utilize PMMA having a stilbene pigment coupled thereto, crosslinked polyurethane having an aminosulfonic acid pigment coupled thereto and so on as the ones having a large electro-optical coefficient $\gamma$.

In the case of using the EO effect, there are advantages that less heat is generated and high-speed control of $\mu$ sec order is possible as compared to the case of using a thermal effect. As a matter of course, using both the electric field and heat together depending on the area can control the propagation state of light.

According to the above-mentioned examples, it is possible to render all of electronic devices such as ICs, slab waveguides and electric wiring layers as one package and mount them at a high density by the surface mounting method.

FOURTH EXAMPLE

Figure 7:
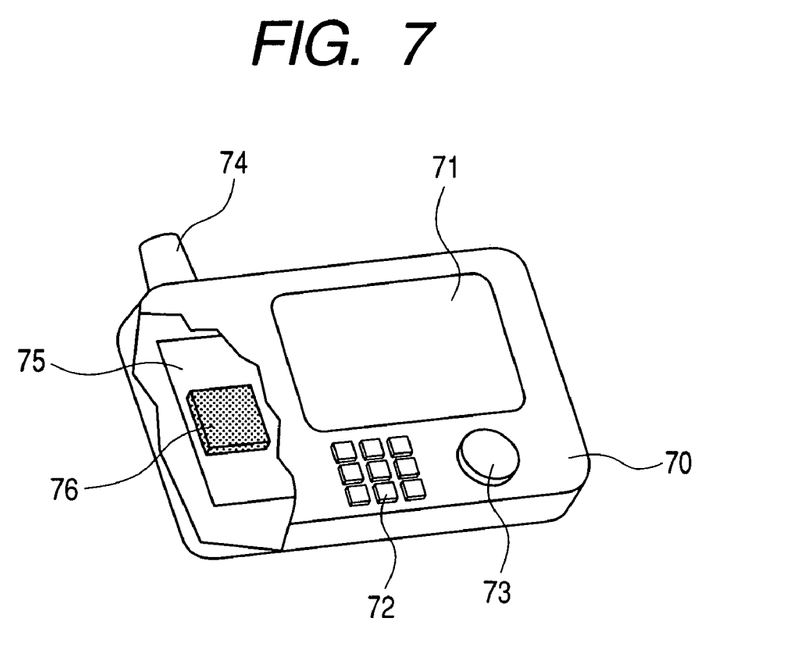
FIG. 7 is a diagram for explaining a mobile equipment according to a fourth example of the present invention.

A fourth example of the present invention is a system built into a mobile terminal 70 as shown in FIG. 7 to which the above configuration is applied. The mobile terminal 70 is equipped with man/machine interfaces such as a display portion 71, a button operation portion 72 and a dial operation portion 73 and a radio portion including an antenna 74 for transfer of signals with the outside. The inside thereof is equipped with a main board 75 and a chip or package 76 containing the optical reconfigurable wiring of the present invention so as to constitute the built-in system.

In recent years, there are a number of radio systems such as pay or mobile telephone networks including WCDMA and CDMA2000x methods, PHS, wireless LAN (IEEE802.11a, b and so on), wireless IEEE1394, UltraWideBand (UWB) and Bluetooth, and smooth switching between these systems and a radio section for processing with one chip are needed. The photoelectric mixedly mounted chip according to the present invention can realize the so-called software radio and dynamically switch a plurality of radio systems at a high speed. Therefore, it is possible to provide a digital electronic equipment that is compact in size and capable of high-speed processing.

In addition to the software radio, the photoelectric mixedly mounted chip according to the present invention can handle multimedia processing accompanied by image or voice such as compression and expansion in various systems at a high speed. It is also possible to have the photoelectric consolidation chip function singly to be used as a small and high-performance radio tag or use a number of chips and form a linkage between the chips with the optical waveguide element 55 such as shown in FIG. 5 to construct a large-scale built-in system such as a robot. It is possible, in addition to these, to apply it to all the electronic equipments requiring an incorporation process in general so as to enhance their performance. For instance, it is possible, by using the photoelectric mixedly mounted device according to the present invention, to construct OA devices such as copying machines, printers, etc. and imaging apparatuses that are capable of high-speed multimedia processing as well as measuring equipments capable of high-speed conversion.

Thus, it is possible to provide at a relatively low cost high-density-mounted electronic equipments, wherein a plurality of architectures are constituted by requisite minimum chips and wirings, change between different architectures can be performed easily, and high-speed multimedia processing or the like is possible. Further, it is possible to select a necessary built-in system in situ and perform an optimum process and also to effect the switching between the systems at a high speed by simple control.

What is claimed is:

1. An electronic device comprising:
    a slab optical waveguide layer having a plurality of electrodes arranged like a grid on a surface thereof; and
    IC chips for exchanging information through the slab optical waveguide layer,
    wherein the slab optical waveguide layer constitutes an optical waveguide for injecting a current or applying a voltage to the electrodes.

2. The electronic device according to claim 1, further comprising an optical path conversion element for converting an optical path to achieve optical coupling between an optical element and the slab optical waveguide layer.

3. The electronic device according to claim 1, wherein the optical element is either a light-emitting element or a light-receiving element.

4. The electronic device according to claim 1, wherein the electrodes are provided on both sides of the slab optical waveguide layer.

* * * * *